United States Patent
Rodgers et al.

(10) Patent No.: US 6,172,633 B1
(45) Date of Patent: Jan. 9, 2001

(54) ENHANCED PULSE WIDTH MODULATOR

(75) Inventors: Arthur G. Rodgers, Windsor; Mark D. Rutherford, Ft. Collins, both of CO (US)

(73) Assignee: LSI Logic Corporation, Milpitas, CA (US)

( * ) Notice: Under 35 U.S.C. 154(b), the term of this patent shall be extended for 0 days.

(21) Appl. No.: 09/404,889

(22) Filed: Sep. 24, 1999

(51) Int. Cl.[7] ....................................................... H03M 1/82
(52) U.S. Cl. ................................................................ 341/152
(58) Field of Search ...................................... 341/53, 152

(56) References Cited

U.S. PATENT DOCUMENTS

| | | | |
|---|---|---|---|
| 3,836,908 | * | 9/1974 | Hegendorfer ........................ 341/152 |
| 4,096,475 | * | 6/1978 | Ong ..................................... 341/152 |
| 5,043,729 | * | 8/1991 | Fujimoto ............................. 341/152 |
| 5,337,338 | * | 8/1994 | Sutton et al. ......................... 341/53 |
| 5,481,560 | * | 1/1996 | Potetz et al. ......................... 341/53 |
| 5,764,165 | * | 6/1998 | Buch .................................... 341/152 |
| 5,774,084 | * | 6/1998 | Brombaugh et al. ............... 341/152 |

\* cited by examiner

*Primary Examiner*—Howard L. Williams
(74) *Attorney, Agent, or Firm*—Christopher P. Maiorana, P.C.

(57) ABSTRACT

An apparatus comprising a first circuit, a second circuit and a third circuit. The first circuit may be configured to generate a first control signal and a second control signal in response to (i) a digital input signal and (ii) a clock signal. The second circuit may be configured to generate a third control signal by scrambling the first control signal. The third circuit may be configured to generate a pulse width modulated output signal in response to (i) the second control signal and (ii) the third control signal.

17 Claims, 3 Drawing Sheets

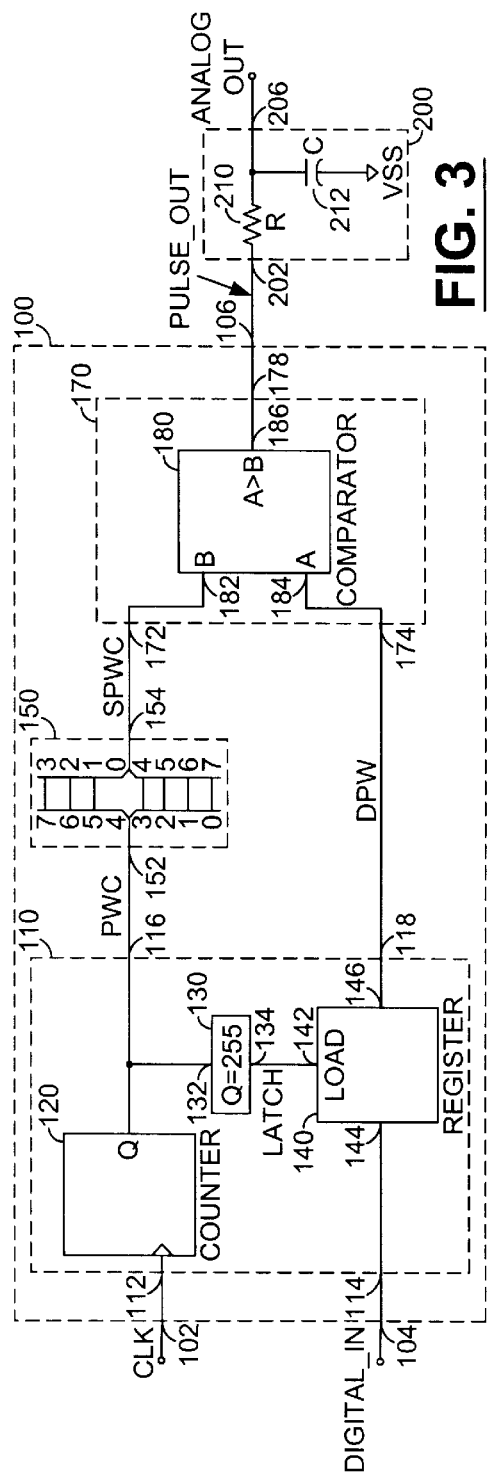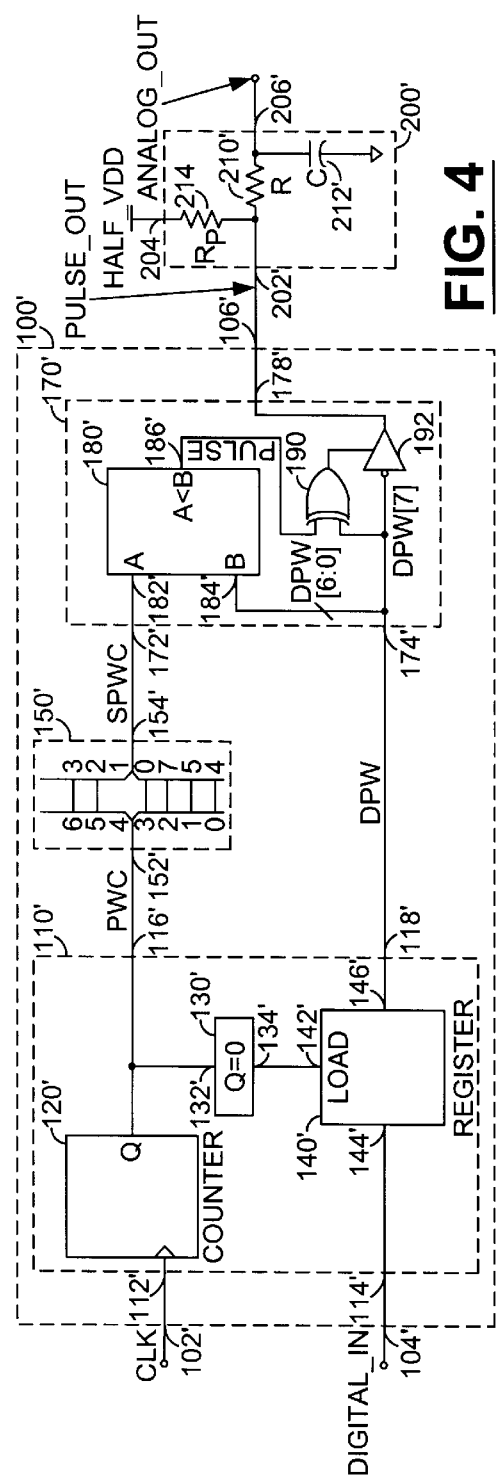
FIG. 3
FIG. 4

ENHANCED PULSE WIDTH MODULATOR

FIELD OF THE INVENTION

The present invention relates to pulse width modulators generally and, more particularly, to an enhanced pulse width modulator.

BACKGROUND OF THE INVENTION

Electronic devices often convert a digital value into an analog value. Digital to Analog Converters (DACS) can perform this function. DACs can be made to be precise and fast, but may require analog circuitry and can be expensive to implement in an integrated circuit (IC).

Another technique that can be used to create an analog voltage from a digital value is called pulse width modulation. A pulse width modulator (PWM) can be implemented digitally in an IC. PWMS can be used as a cheap and simple alternative to a DAC in applications where precision and speed are not critical.

Referring to FIG. 1, a circuit diagram illustrating the components of a conventional 8-bit PWM 10 is shown. The circuit 10 comprises a counter 12, a register 14, a zero detector 16, a comparator 18, and an output driver 20. The PWM 10 works by creating a repeating pulsed output, where the width of the pulse is proportional to the digital input. The circuit 10 generates a pulse signal at the output 22 in response to (i) a clock signal CLK and an 8-bit digital input word DIW. The counter 12 is clocked by a high frequency clock signal CLK. The zero detector 16 triggers the register 14 to latch the digital input word each time the counter output is zero. The counter output is compared to the latched digital input word by the comparator 18.

If the counter output value is less than the digital input word, the pulse signal is HIGH. If the counter output value is greater than or equal to the digital input word, the pulse output is LOW. The circuit 10 generates a HIGH pulse that starts when the counter 12 rolls over to zero and stops when the counter output value equals the digital input word. The pulse output is filtered by a simple resistor/capacitor low-pass filter 30 that smooths the pulse output into a steady analog voltage. The wider the pulse width, the higher the voltage on the filter output.

To get an 8-bit resolution, the counter 12, the register 14, and the comparator 18 must be 8-bit devices. An 8-bit resolution provides 256 discrete pulse widths at a frequency of $F_{CLK}/256$. Filtering the pulse signal with the low-pass filter 30 gives 256 discrete output voltage levels.

One disadvantage to this approach is that the speed the output voltage changes is limited by the cutoff frequency of the filter 30. If the cutoff frequency is increased, the speed of the circuit 10 is improved. However, rippling on the output is also increased, potentially causing other problems in the system. One way that rippling on the output has been reduced is to couple two PWMs together. However, this requires two resistors in the filter 30, two output pins, and twice the circuitry.

SUMMARY OF THE INVENTION

The present invention concerns an apparatus comprising a first circuit, a second circuit and a third circuit. The first circuit may be configured to generate a first control signal and a second control signal in response to (i) a digital input signal and (ii) a clock signal. The second circuit may be configured to generate a third control signal by scrambling the first control signal. The third circuit may be configured to generate a pulse width modulated output signal in response to (i) the second control signal and (ii) the third control signal.

The objects, features and advantages of the present invention include providing an apparatus that may (i) generate high pulses, low pulses, or a high impedance state, (ii) have an output pulse that swings only half the supply voltage, (iii) generate a given voltage resolution at a higher pulse frequency, (iv) spread high and low pulses over a predetermined cycle and/or (v) reduce rippling on a pulse width modulated analog output without reducing the output filter cutoff frequency.

BRIEF DESCRIPTION OF THE DRAWINGS

These and other objects, features and advantages of the present invention will be apparent from the following detailed description and the appended claims and drawings in which:

FIG. 3 is a circuit diagram illustrating a preferred embodiment of the present invention;

FIG. 4 is a circuit diagram illustrating an alternative implementation of the preferred embodiment.

DETAILED DESCRIPTION OF THE PREFERRED EMBODIMENTS

Figure 1:
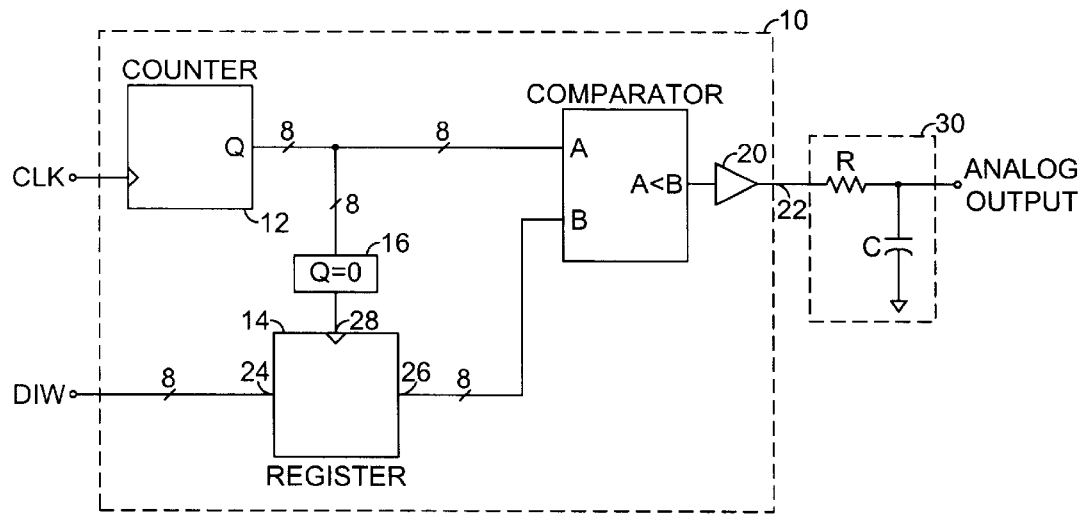
FIG. 1 is a circuit diagram illustrating a conventional pulse width modulator.
Figure 2:
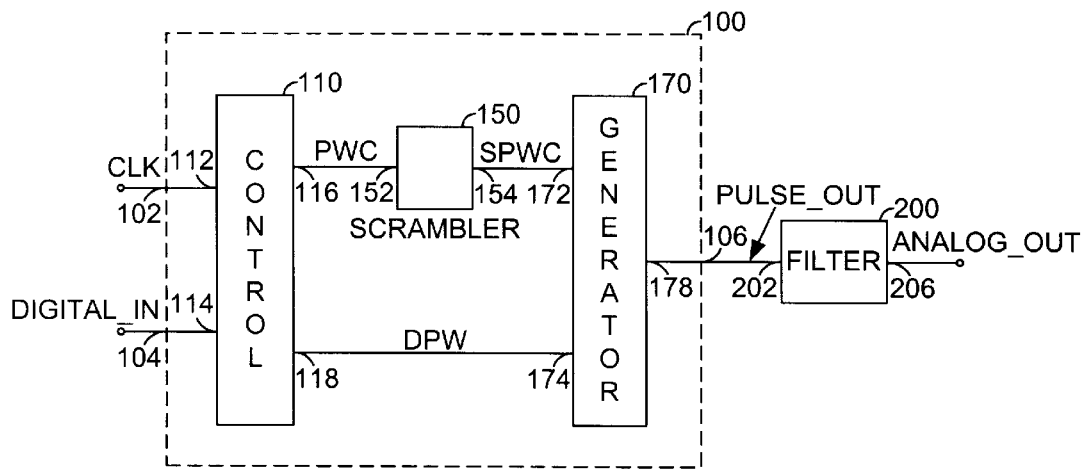
FIG. 2 is a block diagram illustrating a preferred embodiment of the present invention.

Referring to FIG. 2, a block diagram of a circuit 100 is shown in accordance with a preferred embodiment of the present invention. In one example, the circuit 100 may be implemented as an enhanced N-bit pulse width modulator. The circuit 100 is shown implemented, in one example, with a filter 200.

The circuit 100 may have an input 102, an input 104 and an output 106. The circuit 100 may be configured to receive a clock signal (e.g., CLK) at the input 102 and an input signal (e.g., DIGITAL_IN) at the input 104. The signal DIGITAL_IN may be N-bits wide. The circuit 100 may be configured to generate an output signal (e.g., PULSE_OUT) at the output 106 in response to the signal CLK and the signal DIGITAL_IN. The signal PULSE_OUT may be a pulse width modulated output signal. The signal PULSE_OUT may be at (i) a pulse HIGH state or (ii) a pulse LOW state. When the signal PULSE_OUT is at the pulse HIGH state or the pulse LOW state, the width of the pulse will generally be determined by the value of the signal DIGITAL_IN. The pulse HIGH state may be a digital high (e.g., a "1"). The pulse LOW state may be a digital low state (e.g., a "0")

The output 106 may be connected to the filter 200 at an input 202. The filter 200 may be configured to generate an output signal (e.g., ANALOG_OUT) at an output 206 in response to the signal PULSE_OUT. The signal ANALOG_OUT will generally have $2^N$ discrete voltage levels, where N is an integer.

The circuit 100 generally comprises a circuit 110, a circuit 150, and a circuit 170. The circuit 110 may be implemented, in one example, as a control circuit. The circuit 150 may be implemented, in one example, as a scrambler circuit. The circuit 170 may be implemented, in one example, as a generator circuit. The circuit 110 may have an input 112, an input 114, an output 116 and an output 118. The input 112 may be configured to receive the signal CLK. The input 114 may be configured to receive the signal DIGITAL_IN. A control signal (e.g., PWC) may be generated at the output 116 in response to the signal CLK. A control signal (e.g., DPW) may be generated at the output 118 in response to the signal CLK and the signal DIGITAL_IN. The signal DPW will generally be N-bits wide. The signal PWC may be equal to or less than N-bits wide.

The circuit 150 may have an input 152 and an output 154. The input 152 may be configured to receive the signal PWC. The circuit 150 may be configured to generate a control signal (e.g., SPWC) that is a scrambled version of the signal PWC. The signal SPWC is generally equivalent in width to the signal PWC.

The circuit 170 may have an input 172, an input 174 and an output 178. The input 172 may be configured to receive the signal SPWC. The input 174 may be configured to receive the signal DPW. The circuit 170 may be configured to generate the signal PULSE_OUT at the output 178 in response to (i) the signal SPWC and (ii) the signal DPW. The output 178 may be connected to the output 106.

Referring to FIG. 3, a diagram of the circuit 100 illustrating the components in one implementation of the present invention is shown. In one example, the circuit 110 generally comprises a counter 120, a detector circuit 130 and a register 140. The counter 120 may be, in one example, an 8-bit binary counter. However, other types of counters may be implemented accordingly to meet the design criteria of a particular implementation. The counter 120 generally receives the signal CLK from the input 112 at a clock input. The counter 120 generally presents a signal (e.g., PWC) at a Q output. The Q output may be, in one example, 8-bits wide. The Q output may be connected to the output 116.

The detector circuit 130 generally receives the signal PWC at an input 132. The detector circuit 130 may be configured to generate a control signal (e.g., LATCH) at an output 134 in response to the signal PWC having, in one example, a value of 255. The register 140 generally receives the signal LATCH at a load input 142. The register 140 may be configured to receive the signal DIGITAL_IN from at an input 144. The register 140 may be configured to generate the signal DPW at an output 146 in response to the signal DIGITAL_IN and the signal LATCH. The output 146 may be connected to the output 118.

The circuit 150 generally receives the signal PWC at the input 152. The signal PWC may be scrambled, in one example, by rearranging the bits of the signal PWC from an order of 76543210 to an order of 32104567. The rearranged bits are generally presented as the signal SPWC.

The circuit 170 generally comprises, in one example, a comparator 180. The comparator 180 may be implemented, in one example, as an 8-bit magnitude comparator having a B input 182, an A input 184, and an A>B output 186. However, other types of comparators may be implemented accordingly to meet the design criteria of a particular implementation. The comparator 180 generally receives the signal SPWC at the B input 182 and the signal DPW at the A input 184. The comparator 180 may be configured to generate the signal PULSE_OUT at the A>B output 186.

The filter 200 generally comprises a resistor 210 and a capacitor 212. The resistor 210 may have a first terminal, a second terminal, and a known resistance value (e.g., R). The capacitor 212 may have a first terminal, a second terminal, and a known capacitance value (e.g., C). The input 202 is generally connected to the first terminal of the resistor 210. The second terminal of the resistor 210 is generally connected to (i) the first terminal of the capacitor 212 and (ii) the output 206. The second terminal of the capacitor 212 is generally connected to a ground voltage (e.g., VSS).

The signal PULSE_OUT may have, in one example, two output states (i) a HIGH state and (ii) a LOW state. When the signal DIGITAL_IN has a value less than or equal to the value of the signal PWC, the signal PULSE_OUT is generally in the LOW state. When the signal DIGITAL_IN has a value greater than the value of the signal PWC, the signal PULSE_OUT is generally in the HIGH state. The signal PULSE_OUT is generally in the HIGH state for a number of cycles of the signal CLK equivalent to the value of the signal DIGITAL_IN.

By having the circuit 150 re-arranging the bits of the signal PWC from 76543210 to 32104567, the HIGH or LOW states are generally spread out (e.g., generating several shorter pulses instead of generating a single longer pulse) over a period defined by the counter 120 cycling from zero to zero. In the example illustrated, spreading the pulses out over the defined period generally multiplies the frequency of most of the AC energy of the signal PULSE_OUT by about 16. The higher frequency generally decreases the ripple voltage by about 24 dB for a given filter cutoff frequency.

Referring to FIG. 4, a diagram of a circuit 100' illustrating the components in an alternative implementation of the present invention is shown. In one example, the circuit 110' generally comprises a counter 120', a detector circuit 130' and a register 140'. The counter 120' may be, in one example, an N−1 bit binary counter. However, other types of counters may be implemented accordingly to meet the design criteria of a particular implementation. The counter 120' generally receives the signal CLK from the input 112' at a clock input. The counter 120' generally presents a signal (e.g., PWC) at a Q output. The Q output may be N−1 bits wide. The Q output may be connected to the output 116.

The detector circuit 130' generally receives the signal PWC at an input 132'. The detector circuit 130' may be configured to generate a control signal (e.g., LATCH) at an output 134' in response to the signal PWC. The register 140' generally receives the signal LATCH at a clock input 142'. The register 140' may be configured to receive the signal DIGITAL_IN from the input 114' at an input 144'. The register 140' may be configured to generate the signal DPW at an output 146' in response to (i) the signal DIGITAL_IN and (ii) the signal LATCH. The output 146' may be connected to the output 118'.

The circuit 150' generally receives the signal PWC at the input 152'. The signal PWC may be scrambled, in one example, by rearranging the bits of the signal PWC from an order of [N−2, ..., 6, 5, 4, 3, 2, 1, 0] to an order of [(N/2)−1, ... 3,2,1,0,(N/2), .... N−2]. The rearranged bits are generally presented as the signal SPWC at the output 154'.

The circuit 170' generally comprises, in one example, a comparator 180', a gate 190, and a gate 192. The comparator 180' may be implemented, in one example, as an N−1 bit magnitude comparator having an A input 182', a B input 184', and an A<B output 186'. However, other types of comparators may be implemented accordingly to meet the design criteria of a particular implementation. The comparator 180' generally receives the signal SPWC at the A input 182'. The comparator 180' generally receives the lower N−1 bits of the signal DPW at the B input 184'. The A<B output 186' is generally connected to a first input of the gate 190. The gate 190 may be implemented, in one example, as an exclusive OR gate. However, other types of gates may be implemented accordingly to meet the design criteria of a particular implementation. The Nth bit of the signal DPW is generally presented to a second input of the gate 190. An output of the gate 190 is generally connected to an enable input of the gate 192. The gate 192 may be implemented, in one example, as a tri-state inverting buffer. However, other types of gates may be implemented accordingly to meet the design criteria of a particular implementation. The Nth bit of the signal DPW is generally presented to an input of the gate 192. The gate 192 generally presents the signal PULSE_OUT at the output 178'.

The filter 200' generally comprises a resistor 210', a capacitor 212', a resistor 214 and an input 204. The resistor 210' may have a first terminal, a second terminal, and a known resistance value (e.g., R). The capacitor 212' may have a first terminal, a second terminal, and a known capacitance value (e.g., C). The resistor 214 may have a first terminal, a second terminal, and a known resistance value (e.g., Rp). The input 204 may be configured to receive a supply voltage (e.g., HALF_VDD). The input 202' is generally connected to the first terminal of the resistor 210' and the first terminal of the resistor 214. The second terminal of the resistor 210' is generally connected to (i) the first terminal of the capacitor 212', and (ii) the output 206'. The second terminal of the resistor 214 is generally connected to the supply voltage HALF_VDD. The second terminal of the capacitor 214 is generally connected to a ground voltage (e.g., VSS).

The signal PULSE_OUT may have three output states (i) a drive HIGH state, (ii) a drive LOW state, and (iii) a high impedance state. When the signal DIGITAL_IN is set to a predetermined midscale value, the signal PULSE_OUT may be in a continuous high impedance state. With the signal PULSE_OUT in the high impedance state, the resistor 214 may pull the signal ANALOG_OUT to the supply voltage HALF_VDD. As the signal DIGITAL_IN increases from midscale, the signal PULSE_OUT generally begins to generate a series of HIGH pulses having a width determined by the magnitude of the difference between the signal DIGITAL_IN and the midscale value. As the signal DIGITAL_IN decreases from the midscale value, the signal PULSE_OUT begins to generate a series of LOW pulses having a width determined by the magnitude of the difference between the signal DIGITAL_IN and the midscale value. When the signal DIGITAL_IN is set to the midscale value, there is generally no ripple on the signal ANALOG_OUT. When the signal DIGITAL_IN is not equivalent to the midscale value, the signal PULSE_OUT generally swings to only half of the supply voltage HALF_VDD generally reducing ripple voltage by about 6 dB compared to the conventional PWM for a given filter cutoff frequency. The resistance Rp must be of sufficiently low impedance to prevent stray capacitance on the output 106' from causing offset errors in the signal ANALOG_OUT.

An N-1 bit counter may be used instead of an N-bit counter and still get an N-bit resolution. Bit N of the signal DIGITAL_IN is generally only determinative of the pulse polarity, and not the pulse width. The use of N-1 bits may reduce ripple voltage by another 6 dB by generally increasing the pulse frequency to $F_{CLK}/2^{N-1}$.

A further reduction in the ripple on the signal ANALOG_OUT is generally obtained with the scrambler circuit 150'. The scrambler circuit 150' may generate the signal SPWC by changing the order of the bits of the signal PWC. In one example, the order may be changed from 6543210 to 3210456. By re-arranging the bits, the high or low pulses are generally spread out (e.g., generating several shorter pulses instead of generating a single longer pulse) over a period defined by the counter 130 cycling from zero to zero. Spreading the pulses out over the defined period generally multiplies the frequency of most of the AC energy of the signal PULSE_OUT by about 8. The higher frequency generally decreases the ripple voltage by about 18 dB for a given filter cutoff frequency.

Figure 5:
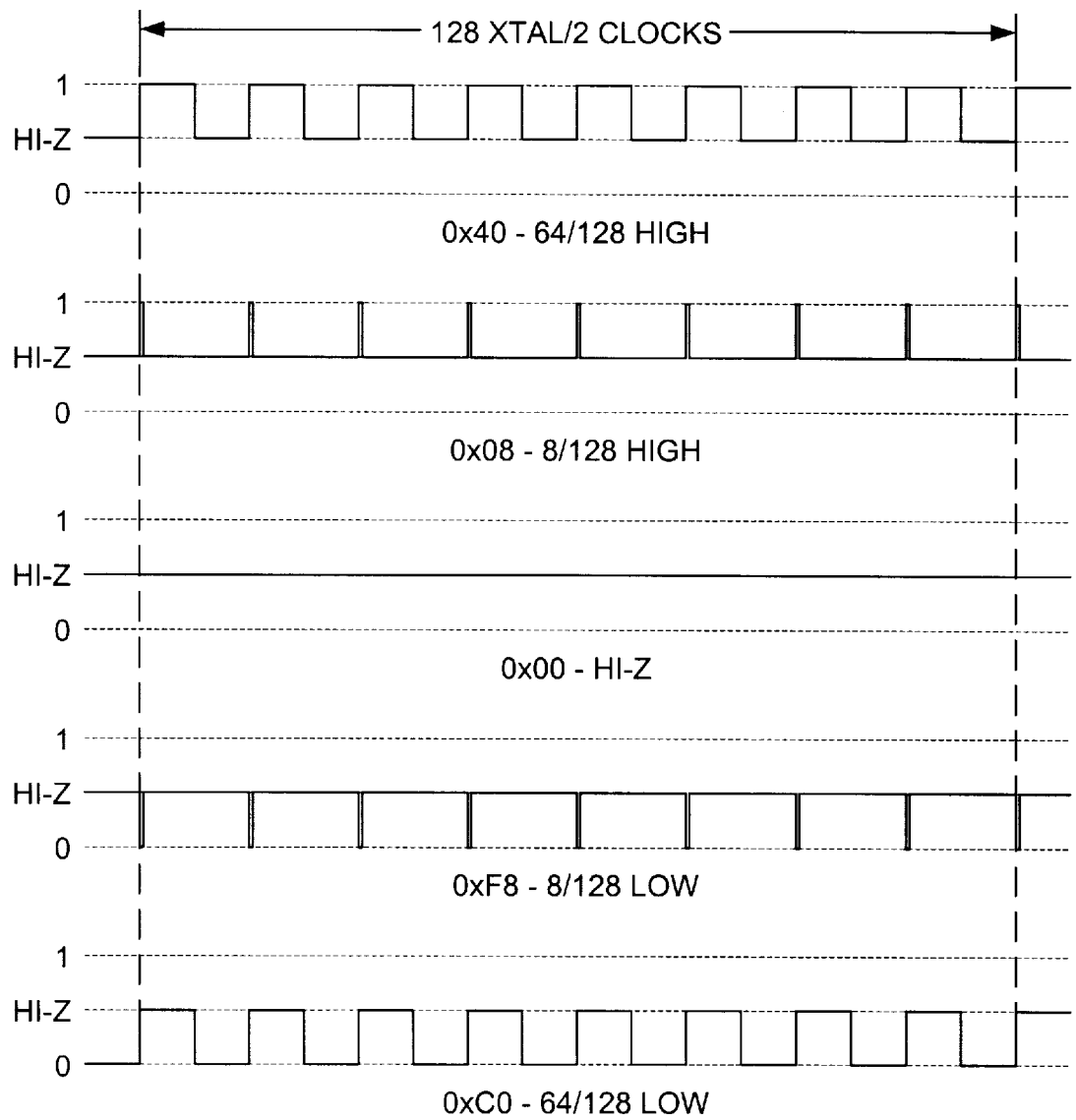
FIG. 5 is a timing diagram illustrating example waveforms of the circuit of FIG. 4.

Referring to FIG. 5, a timing diagram illustrating the waveforms of an 8-bit implementation of the circuit 100' is shown. The waveforms illustrate the signal PULSE_OUT that may be generated for different values of the signal DIGITAL_IN.

In one example, the circuit 100 and the circuit 100' may be implemented using a software design tool, such as the verilog hardware description language (HDL) as defined by the IEEE 1364–1995 standard.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate a first control signal and a second control signal in response to (i) a digital input signal and (ii) a clock signal;
   a second circuit configured to generate a third control signal by scrambling said first control signal; and
   a third circuit comprising (a) a tristate inverting buffer configured to generate a pulse modulated output signal in response to (i) a most significant bit of said second control signal and (ii) an enable signal, (b) an enable circuit configured to generate said enable signal in response to the result of a logical combination of (i) a pulse signal and (ii) said most significant bit of said second control signal and (c) a comparator configured to generate said pulse signal in response to (i) said second control signal and (ii) said third control signal.

2. The apparatus according to claim 1, wherein said digital input signal is 8-bits wide.

3. The apparatus according to claim 1, further comprising:
   a fourth circuit configured to generate an analog signal in response to said pulse width modulated output signal.

4. The apparatus according to claim 1, further comprising;
   a fourth circuit configured to generate an analog signal in response to (i) said pulse width modulated output signal and (ii) a supply voltage.

5. The apparatus according to claim 1, wherein said second circuit scrambles said first control signal by rearranging the bit order of said first control signal.

6. The apparatus according to claim 5, wherein said first circuit further comprises a counter configured to generate said first control signal in response to said clock signal.

7. The apparatus according to claim 6, wherein said first circuit further comprises a detector circuit configured to generate a latch signal in response to said first control signal.

8. The apparatus according to claim 7, wherein said first circuit further comprises a register configured to latch said digital input signal in response to said latch signal.

9. The apparatus according to claim 1, wherein:
   said first circuit comprises (i) a counter configured to generate a first control signal in response to said clock signal, (ii) a detector circuit configured to generate a latch signal in response to said first control signal, and (iii) a register configured to latch said digital input signal in response to said latch signal; and (i) said comparator is further configured to generate said pulse signal in response to bit N−2 through bit 0 of said second control signal and said third control signal, (ii) said enable circuit is further configured to generate said enable signal in response to the result of a logical combination of said pulse signal and bit N of said second control signal, and (iii) said tristate inverting buffer is further configured to invert bit N−1 of said third control signal and generate said pulse width modulated output signal in response to said inverted signal and said enable signal.

10. The apparatus according to claim 9, further comprising:
   a fourth circuit configured to generate an analog signal in response to said pulse width modulated output signal, wherein said fourth circuit comprises an input resistor, an integrating capacitor, and a pull-up resistor connected to a supply voltage.

11. The apparatus according to claim 1, further comprising:
   a fourth circuit configured to generate an analog signal in response to said pulse width modulated output signal, wherein said fourth circuit comprises an input resistor, an integrating capacitor, and a pull-up resistor connected to a supply voltage.

12. A method for generating a pulse width modulated signal comprising the steps of:
   (A) generating a first control signal in response to a clock signal;
   (B) generating a second control signal in response to (i) said clock signal and (ii) a digital input signal;
   (C) generating a third control signal by scrambling said first control signal;
   (D) generating said pulse width modulated signal in response to (i) a most significant bit of said second control signal and (ii) an enable signal;
   (E) generating said enable signal in response to the result of a logical combination of (i) a pulse signal and (ii) said most significant bit of said second control signal; and
   (F) generating said pulse signal in response to a comparison of (i) said second control signal and (ii) said third control signal.

13. The method according to claim 12, wherein step (A) generates said first control signal by clocking a counter with said clock signal.

14. The method according to claim 12, wherein said pulse width modulated signal is generated by the steps of:
   (A) generating a first state for digital values less than or equal to a predetermined value;
   (B) generating a second state for digital values greater than said predetermined value.

15. The method of claim 14 further comprising the step of:
   (C) generating an analog signal proportional the duration of said first state.

16. The method according to claim 12, wherein said pulse width modulated signal is generated by the steps of:
   generating a high impedance for a digital value equal to a predetermined value;
   generating a series of pulses of a first polarity for digital values greater than said predetermined value;
   generating a series of pulses of a second polarity for digital values less than said predetermined value; and
   varying the width of said pulses in response to the magnitude of the difference between said digital value and said predetermined value.

17. An apparatus comprising:
   a first circuit configured to generate a first control signal and a second control signal in response to (i) a digital input signal and (ii) a clock signal;
   a second circuit configured to generate a third control signal by scrambling said first control signal;
   a third circuit configured to generate a pulse width modulated output signal in response to (i) said second control signal and (ii) said third control signal, wherein said first circuit comprises (i) a counter configured to generate a first control signal in response to said clock signal, (ii) a detector circuit configured to generate a latch signal in response to said first control signal, and (iii) a register configured to latch said digital input signal in response to said latch signal, and said third circuit comprises (i) a comparator configured to generate a pulse signal in response to bit N−2 through bit 0 of said second control signal and said third control signal, (ii) a device configured to generate an enable signal in response to the result of a logical combination of said pulse signal and bit N of said second control signal, and (iii) a tristate inverting buffer configured to invert bit N−1 of said third control signal and generate said pulse width modulated output signal in response to said inverted signal and said enable signal.

* * * * *